United States Patent
Ota et al.

(10) Patent No.: US 9,530,891 B2
(45) Date of Patent: Dec. 27, 2016

(54) SEMICONDUCTOR DEVICE AND METHOD OF MANUFACTURING THE SAME

(71) Applicant: Kabushiki Kaisha Toshiba, Tokyo (JP)

(72) Inventors: Kensuke Ota, Fujisawa (JP); Toshinori Numata, Kamakura (JP); Masumi Saitoh, Yokohama (JP); Chika Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 13/939,207

(22) Filed: Jul. 11, 2013

(65) Prior Publication Data

US 2013/0299907 A1 Nov. 14, 2013

Related U.S. Application Data

(62) Division of application No. 13/415,592, filed on Mar. 8, 2012, now Pat. No. 8,518,769.

(30) Foreign Application Priority Data

May 27, 2011 (JP) .................................. 2011-119556

(51) Int. Cl.
*H01L 29/78* (2006.01)
*H01L 29/786* (2006.01)
*H01L 29/00* (2006.01)

(52) U.S. Cl.
CPC ............. *H01L 29/786* (2013.01); *H01L 29/00* (2013.01); *H01L 29/785* (2013.01); *H01L 29/78696* (2013.01)

(58) Field of Classification Search
CPC ........... H01L 21/7624; H01L 21/76264; H01L 21/823431; H01L 21/823821; H01L 21/84; H01L 21/845; H01L 27/0886; H01L 27/0924; H01L 27/1203; H01L 27/1211; H01L 29/41791; H01L 29/66795; H01L 29/785; H01L 29/786; H01L 29/78696

(Continued)

(56) References Cited

U.S. PATENT DOCUMENTS 6,764,884 B1 * 7/2004 Yu ..................... H01L 29/42392
257/E21.444
7,151,034 B2 12/2006 Lee et al.

(Continued)

OTHER PUBLICATIONS

Chen et al.; "Experimental Study of Mobility in [110]- and [100]-Directed Multiple Silicon Nanowire GAA MOSFETs on (100) SOI", 2008 Symposium on VLSI Technology Digest of Technical Papers, pp. 32-33, (2008).

(Continued)

*Primary Examiner* — Khiem D Nguyen
*Assistant Examiner* — Pauline Vu
(74) *Attorney, Agent, or Firm* — Finnegan, Henderson, Farabow, Garrett & Dunner LLP

(57) ABSTRACT

A semiconductor device of an embodiment includes: an insulating film including: a first region extending in a first direction; second and third regions arranged at a distance from each other; and fourth and fifth regions each having a concave shape, the fourth and fifth regions each having a smaller film thickness than a film thickness of each of the first through third regions; a semiconductor layer formed in a direction from the fourth region toward the fifth region, the semiconductor layer having a smaller width than a width of each of source and drain regions, the semiconductor layer being connected to the source and drain regions; a gate electrode placed on the opposite side of a gate insulating film from the semiconductor layer on the first region; and a gate sidewall formed on a side face of the gate electrode.

1 Claim, 13 Drawing Sheets

A-A CROSS-SECTION

(58) Field of Classification Search
USPC .......................................................... 257/347
See application file for complete search history.

(56) References Cited

U.S. PATENT DOCUMENTS

| | | | |
|---|---|---|---|
| 7,202,118 B1* | 4/2007 | Krivokapic | H01L 29/66636 257/E21.415 |
| 7,456,476 B2* | 11/2008 | Hareland et al. | 257/349 |
| 7,517,764 B2 | 4/2009 | Booth et al. | |
| 2004/0262688 A1* | 12/2004 | Nowak et al. | 257/350 |
| 2005/0017377 A1* | 1/2005 | Joshi | H01L 21/84 257/368 |
| 2005/0121703 A1* | 6/2005 | Hieda et al. | 257/288 |
| 2005/0124099 A1* | 6/2005 | Beintner | H01L 21/823437 438/164 |
| 2005/0285149 A1* | 12/2005 | Chang | H01L 29/42384 257/210 |
| 2005/0285186 A1* | 12/2005 | Fujiwara | 257/327 |
| 2008/0102586 A1 | 5/2008 | Park | |
| 2009/0104746 A1* | 4/2009 | Clifton | H01L 29/0673 438/299 |
| 2010/0252801 A1 | 10/2010 | Sekaric et al. | |
| 2010/0252814 A1 | 10/2010 | Sekaric et al. | |
| 2010/0252815 A1* | 10/2010 | Chidambarrao | B82Y 10/00 257/24 |
| 2010/0258868 A1* | 10/2010 | Yin | H01L 29/0653 257/347 |
| 2011/0133162 A1* | 6/2011 | Bangsaruntip | B82Y 10/00 257/24 |
| 2011/0133163 A1 | 6/2011 | Bangsaruntip et al. | |
| 2011/0133166 A1 | 6/2011 | Bangsaruntip et al. | |
| 2011/0133169 A1 | 6/2011 | Bangsaruntip et al. | |
| 2011/0147842 A1 | 6/2011 | Cappellani et al. | |
| 2011/0165738 A1* | 7/2011 | Tezuka et al. | 438/150 |
| 2011/0278546 A1 | 11/2011 | Bangsaruntip et al. | |
| 2011/0315950 A1 | 12/2011 | Sleight et al. | |
| 2012/0007051 A1 | 1/2012 | Bangsaruntip et al. | |
| 2012/0056264 A1* | 3/2012 | Anderson | H01L 29/66795 257/347 |
| 2012/0104538 A1* | 5/2012 | Anderson et al. | 257/506 |
| 2012/0146053 A1 | 6/2012 | Saitoh et al. | |

OTHER PUBLICATIONS

Saitoh et al.; "Short-Channel Performance and Mobility Analysis of <110>- and <100>-Oriented Tri-Gate Nanowire MOSFETs With Raised Source/Drain Extensions", 2010 Symposium on VLSI Technology Digest of Technical Papers, pp. 169-170, (2010).

* cited by examiner

A-A CROSS-SECTION

B-B CROSS-SECTION

C-C CROSS-SECTION

D-D CROSS-SECTION

E-E CROSS-SECTION

F-F CROSS-SECTION

H-H CROSS-SECTION

I-I CROSS-SECTION

J-J CROSS-SECTION

L-L CROSS-SECTION

M-M CROSS-SECTION

N-N CROSS-SECTION

O-O CROSS-SECTION

P-P CROSS-SECTION

Q-Q CROSS-SECTION

R-R CROSS-SECTION

SEMICONDUCTOR DEVICE AND METHOD OF MANUFACTURING THE SAME

CROSS-REFERENCE TO RELATED APPLICATION

This is a division of application Ser. No. 13/415,592, filed Mar. 8, 2012, which is incorporated herein by reference.

This application is based upon and claims the benefit of priority from prior Japanese Patent Application No. 2011-119556 filed on May 27, 2011 in Japan, the entire contents of which are incorporated herein by reference.

FIELD

Embodiments described herein relate generally to semiconductor devices and methods of manufacturing the semiconductor devices.

BACKGROUND

Nanowire-type channel transistors (nanowire transistors) that can restrain short-channel effects, instead of conventional planar transistors, are now expected to serve as structures for realizing hyperfine MOSFETs of 30 nm or less in gate length. Such a nanowire transistor includes: a silicon substrate; a buried oxide layer formed on the silicon substrate; a semiconductor layer formed on the buried oxide layer, the semiconductor layer including one or more plate-like nanowire made of silicon, the nanowire being to be a channel region; a gate insulating film formed on the side faces and upper face of the nanowire; a gate electrode formed on the gate insulating film; gate sidewalls formed on both sides (in the gate length direction) of the gate electrode; and a source region and a drain region formed in wider portions of the nanowire and the semiconductor layer, with the channel region being interposed between the source region and the drain region. In the nanowire, the region having the gate electrode thereon functions as the channel region. The channel region has a plate-like structure that is approximately 3 to 25 nm in width (length in the gate width direction), and approximately 3 to 40 nm in height. Since the channel region is covered with the gate electrode, the gate electrode has strong control over the channel region, and restrains short-channel effects. A nanowire transistor is also called a tri-gate transistor, as the upper face and both side faces, a total of three faces, of the nanowire function as the channel.

In a nanowire transistor structure, the parasitic resistance of the source/drain portions is higher than that of a planar transistor, and the on-state current is smaller than that of a planar transistor. As a technique to lower the parasitic resistance, epitaxially growing the source/drain portions is effective. By doing so, the heights and widths of the source/drain portions formed on the burled oxide layer are increased through epitaxial growth, and accordingly, the parasitic resistance is lowered. However, the portion surrounded by the gate sidewalls is not epitaxially grown, and the height and width of such a portion remain small. As a result, the portion surrounded by the gate sidewalls becomes a parasitic-resistance bottleneck region, resulting in a high parasitic resistance.

To solve this problem, the bottleneck region located below the sidewalls can be made shorter by using thin sidewalls, and the parasitic resistance can be lowered, according to a report. However, the portion located below the sidewalls still remains a bottleneck region with a high parasitic resistance. Also, the distances between the gate and the epitaxially-grown source/drain portions become shorter. Therefore, the parasitic capacitance becomes larger, resulting in performance degradation. That is, where the sidewalls are made thinner, the parasitic resistance can be lowered, but the parasitic capacitance increases. Where the sidewalls are made thicker, the parasitic capacitance can be reduced, but the parasitic resistance becomes higher. As described above, there is a trade-off relationship between the parasitic capacitance and the parasitic resistance.

DETAILED DESCRIPTION

A method of manufacturing a semiconductor device according to an embodiment, includes: forming a first insulating layer on a first semiconductor layer; forming a second semiconductor layer on the first insulating layer, the second semiconductor layer including a first region and second and third regions, the second and third regions each having a greater width than a width of the first region, the second and third regions being connected to the first region; forming a gate insulating film at least on a side face of the first region of the second semiconductor layer; forming a gate electrode on the opposite side of the gate insulating film from the first region, side faces of the gate electrode facing the second and third regions, respectively; forming gate sidewalls made of an insulating material on the side faces of the gate electrode; forming concave portions by performing etching on portions of the first insulating layer and another portions of the first insulating layer, and reducing a layer thickness of the first insulating layer in each of the portions and the another portions, the portions of the first insulating layer being located between the gate sidewall and the second region and between the gate sidewalls and the third region, the another portions of the first insulating layer being located below the gate sidewalls and immediately below the first region; and forming an epitaxially-grown layer on portions of the concave portions by performing epitaxial growth using the first region as a seed, the portions of the concave portions being located immediately below the first region.

The following is a description of embodiments, with reference to the accompanying drawings.

First Embodiment

Figure 1:
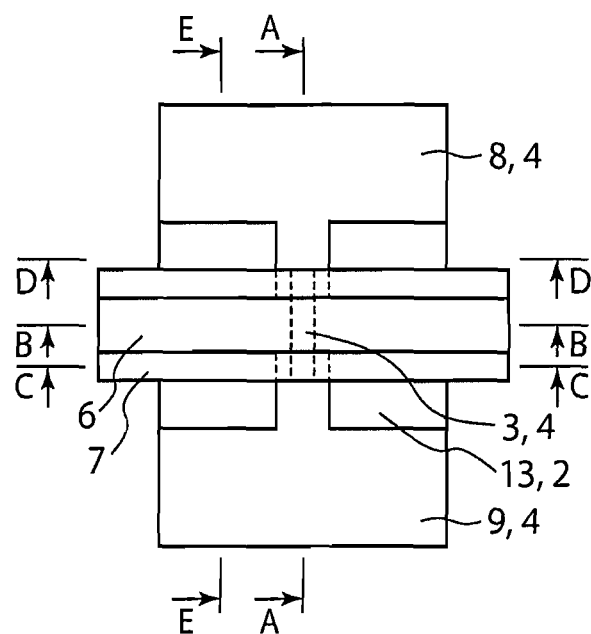
FIG. 1 is a top view of a semiconductor device according to a first embodiment.
Figure 2:
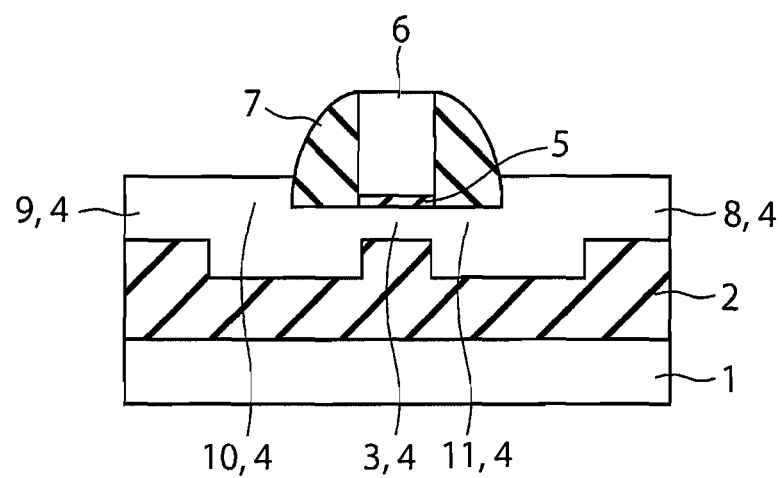
FIG. 2 is a cross-sectional view of the semiconductor device of the first embodiment, taken along the section plane A-A defined in FIG. 1.
Figure 3:
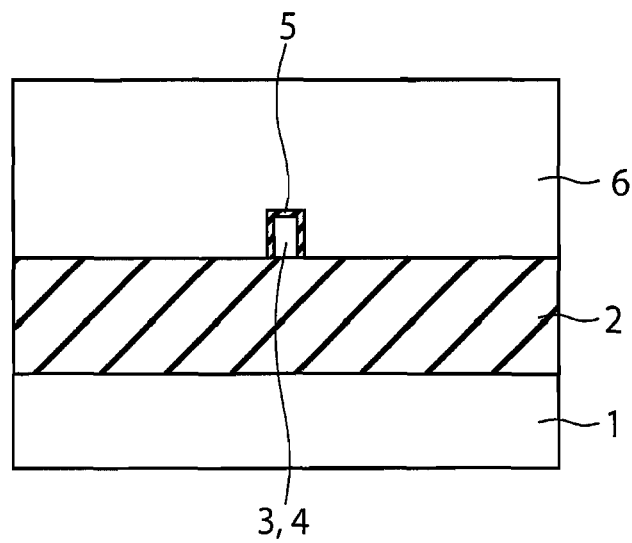
FIG. 3 is a cross-sectional view of the semiconductor device of the first embodiment, taken along the section plane B-B defined in FIG. 1.
Figure 4:
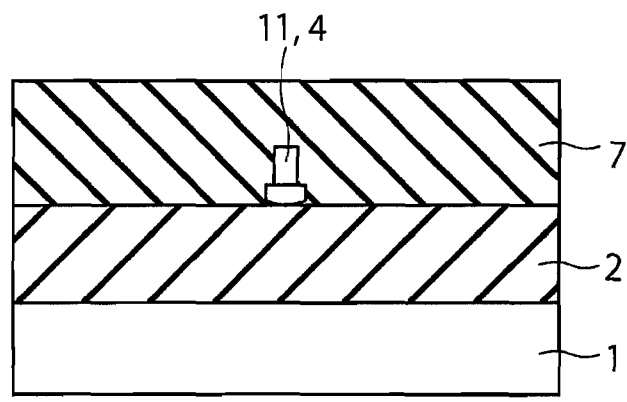
FIG. 4 is a cross-sectional view of the semiconductor device of the first embodiment, taken along the section plane C-C defined in FIG. 1.
Figure 5:
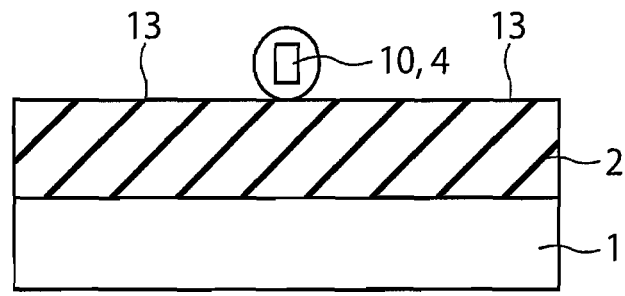
FIG. 5 is a cross-sectional view of the semiconductor device of the first embodiment, taken along the section plane D-D defined in FIG. 1.
Figure 6:
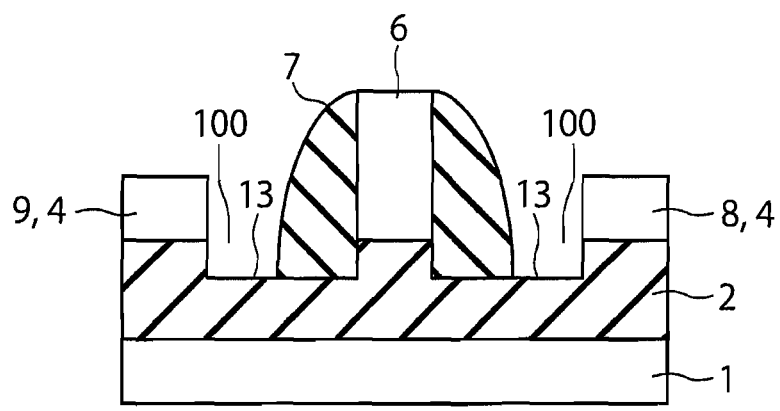
FIG. 6 is a cross-sectional view of the semiconductor device of the first embodiment, taken along the section plane E-E defined in FIG. 1.

Referring to FIGS. 1 through 6, a semiconductor device according to a first embodiment is described. The semiconductor device of this embodiment includes a nanowire transistor. FIG. 1 is a top view of the nanowire transistor. FIG. 2 is a cross-sectional view of the nanowire transistor, taken along the section plane A-A defined in FIG. 1. FIG. 3 is a cross-sectional view of the nanowire transistor, taken along the section plane B-B defined in FIG. 1. FIG. 4 is a cross-sectional view of the nanowire transistor, taken along the section plane C-C defined in FIG. 1. FIG. 5 is a cross-sectional view of the nanowire transistor, taken along the section plane D-D defined in FIG. 1. FIG. 6 is a cross-sectional view of the nanowire transistor, taken along the section plane E-E defined in FIG. 1. The cross-section A-A is a cross-section in the gate length direction in the nanowire region. The cross-section B-B is a cross-section in the gate width direction extending through the gate electrode. The cross-section C-C is a cross-section in the gate width direction extending through the gate sidewalls. The cross-section D-D is a cross-section in the gate width direction outside the gate sidewalls. The cross-section E-E is a cross-section in the gate length direction outside the nanowire region.

This nanowire transistor includes an insulating film 2 that is placed on a silicon substrate 1 and is formed with an oxide film, for example, and a silicon layer 4 placed on the oxide film 2 (FIG. 2). The silicon layer 4 includes at least one plate-like nanowire region including a channel region 3, and a source region 8 and a drain region 9 that are formed on both sides of the nanowire region and have greater widths than that of the nanowire region (FIGS. 1 and 2). The silicon layer 4 is made of single-crystal silicon, for example. However, the silicon layer 4 can be made of amorphous silicon or polycrystalline silicon, instead of single-crystal silicon. A gate insulating film 5 is placed so as to cover the side faces extending in the direction from the source region 8 toward the drain region 9 and the upper face of the channel region 3, and a gate electrode 6 is placed so as to cover the gate insulating film 5 (FIG. 3). Gate sidewalls 7 made of an insulating material are placed at the side portions of the gate electrode 6 on the source region side and the drain region side.

In this embodiment, the oxide film 2 has a smaller film thickness and has concave shapes in the regions that exclude the regions located immediately below the gate electrode 6 and the regions where the source region 8 and the drain region 9 are formed (FIGS. 2 through 6).

In the nanowire transistor having the above described structure, the region on which the gate electrode 6 is formed in the nanowire region functions as the channel region 3. The channel region 3 has a plate-like structure (a nanowire structure) that is approximately 3 to 25 nm in width or length in the gate width direction, and is approximately 3 to 40 nm in height. The oxide film 2 has smaller film thicknesses and concave shapes in the regions 100 located immediately below nanowire portions 10 outside the gate sidewalls 7 and nanowire portions 11 immediately below the gate sidewalls 7. The volumes of the source region 8 and the drain region 9 expand upward through epitaxial growth as will be described later. The volumes of the nanowire portions 10 located outside the gate sidewalls 7 expand vertically and horizontally through epitaxial growth, and the volumes of the nanowire portions 11 located immediately below the gate sidewalls 7 expand downward through epitaxial growth (FIGS. 2 and 5). In other words, through epitaxial growth, the nanowire portions 10 and 11 are formed to fill the concave regions 100 of the oxide film 2 located immediately below the respective portions. It should be noted that the outside of the gate sidewalls 7 means the opposite side of each gate sidewall 7 from the gate electrode 6, and the side on which the gate electrode 6 is provided is inside the gate sidewalls 7. As shown in FIGS. 1 and 6, the portions of the concave portions 100 outside the gate sidewalls 7 form regions 13 through which the oxide film 2 is exposed. As is apparent from the above description, the nanowire region is designed to include the channel region 3 and the nanowire portions 10 and 11.

Referring now to FIG. 3 and FIGS. 7 through 14, a method of manufacturing the semiconductor device according to the first embodiment is described.

Figure 7:
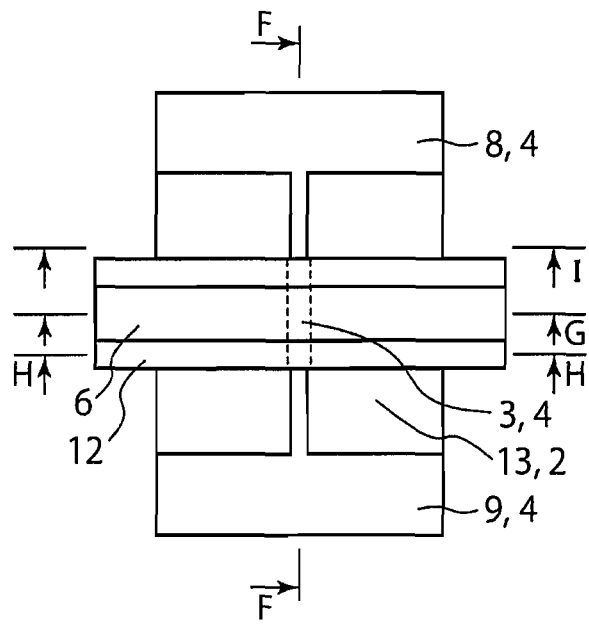
FIG. 7 is a top view showing a procedure for manufacturing the semiconductor device according to the first embodiment.
Figure 8:
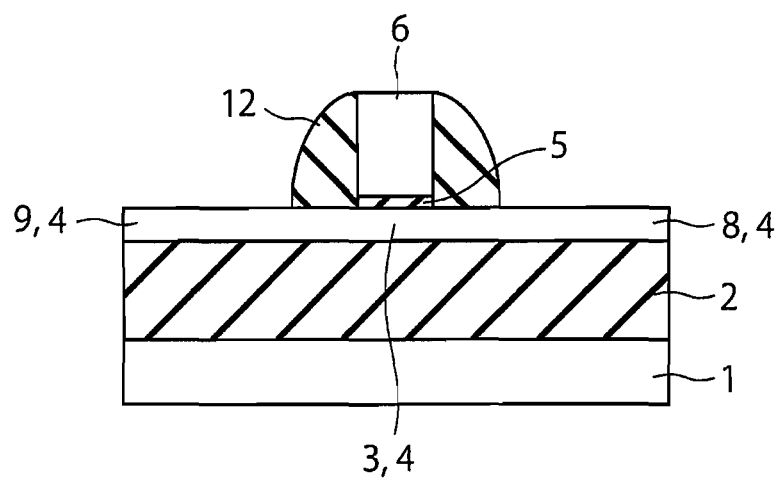
FIG. 8 is a cross-sectional view showing a procedure for manufacturing the semiconductor device according to the first embodiment.
Figure 9:
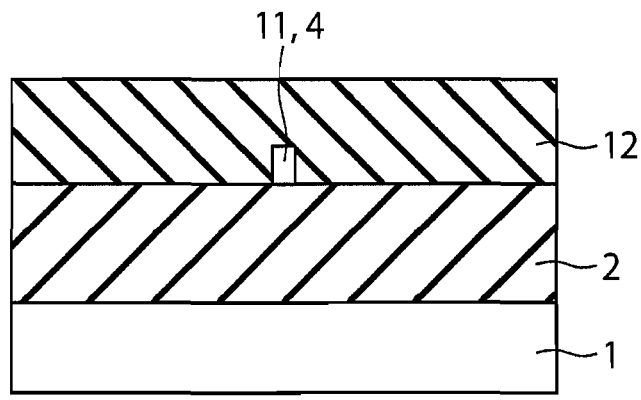
FIG. 9 is a cross-sectional view showing a procedure for manufacturing the semiconductor device according to the first embodiment.
Figure 10:
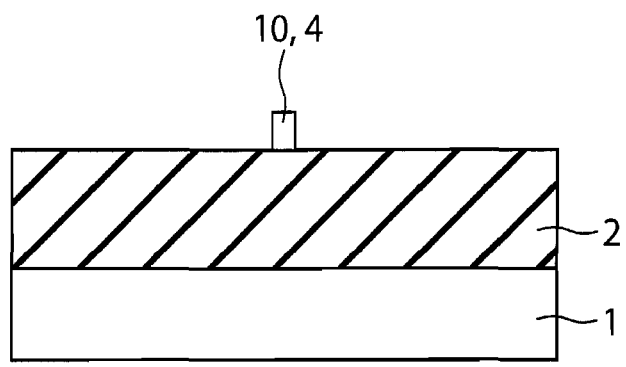
FIG. 10 is a cross-sectional view showing a procedure for manufacturing the semiconductor device according to the first embodiment.

First, as shown in FIG. 3 and FIGS. 7 through 10, the oxide film 2 is formed on the bulk silicon substrate 1, and a silicon layer is formed on the oxide film 2. Patterning is then performed on the silicon layer, to form the silicon layer 4 having a nanowire structure including at least one nanowire region. The gate insulating film 5 is formed to cover the upper face and side faces of the region to be the channel in the nanowire region of the silicon layer 4. The gate electrode 6 is formed to cover the gate insulating film 5. After that, gate sidewalls 12 made of a different insulating material from the oxide film 2 are formed at the side portions of the gate electrode 6 on the source region side and the drain region side. FIG. 7 is a top view of the nanowire transistor in this situation. FIG. 8 is a cross-sectional view of the nanowire transistor, taken along the section plane F-F defined in FIG. 7. FIG. 3 is a cross-sectional view of the nanowire transistor, taken along the section plane G-G defined in FIG. 7. FIG. 9 is a cross-sectional view of the nanowire transistor, taken along the section plane H-H defined in FIG. 7. FIG. 10 is a cross-sectional view of the nanowire transistor, taken along the section plane I-I defined in FIG. 7. The cross-section F-F is a cross-section in the gate length direction in the nanowire region. The cross-section H-H is a cross-section in the gate width direction extending through the gate sidewalls 12. The cross-section I-I is a cross-section in the gate width direction of the nanowire region outside the gate sidewalls 12. The thickness of the silicon layer 4 is approximately 3 to 40 nm. The nanowire portions located outside the gate sidewalls 12 are denoted by reference numeral 10, and the nanowire portions located below the gate sidewalls 12 are denoted by reference numeral 11. Single-crystal silicon is used as the silicon layer 4, for example. However, polycrystalline silicon or amorphous silicon can be used, instead of single-crystal silicon. Silicon nitride films can be used as the gate sidewalls 12, for example.

Figure 11:
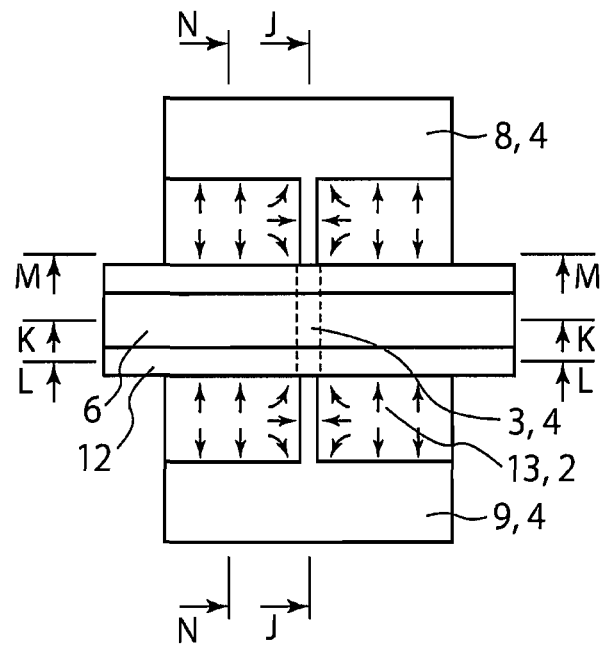
FIG. 11 is a cross-sectional view showing a procedure for manufacturing the semiconductor device according to the first embodiment.
Figure 12:
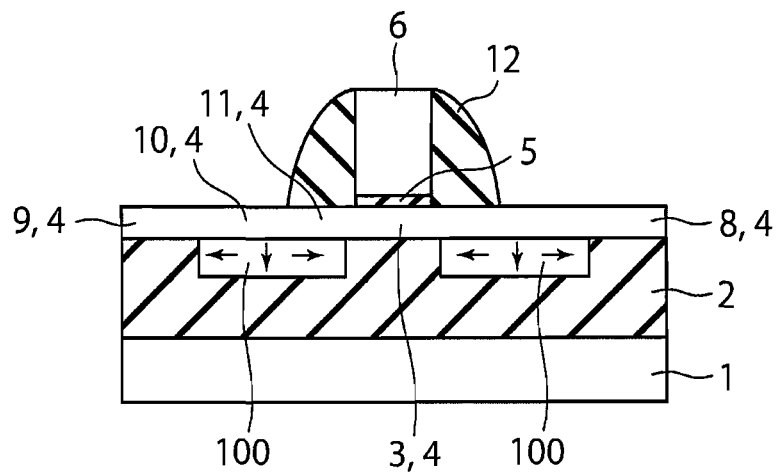
FIG. 12 is a cross-sectional view showing a procedure for manufacturing the semiconductor device according to the first embodiment.
Figure 13:
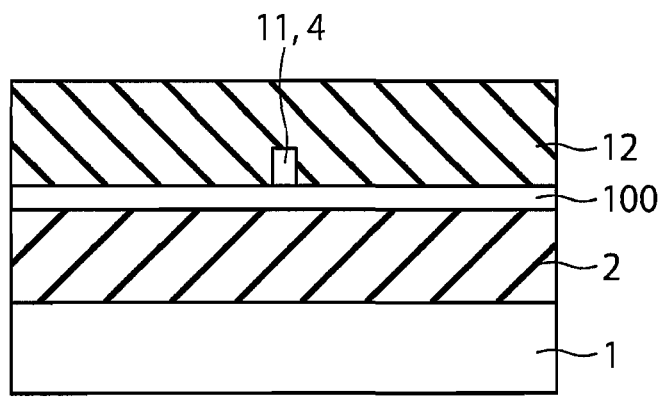
FIG. 13 is a cross-sectional view showing a procedure for manufacturing the semiconductor device according to the first embodiment.
Figure 14:
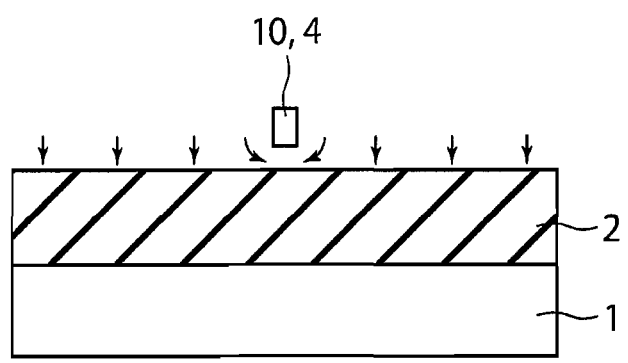
FIG. 14 is a cross-sectional view showing a procedure for manufacturing the semiconductor device according to the first embodiment.
Figure 15:
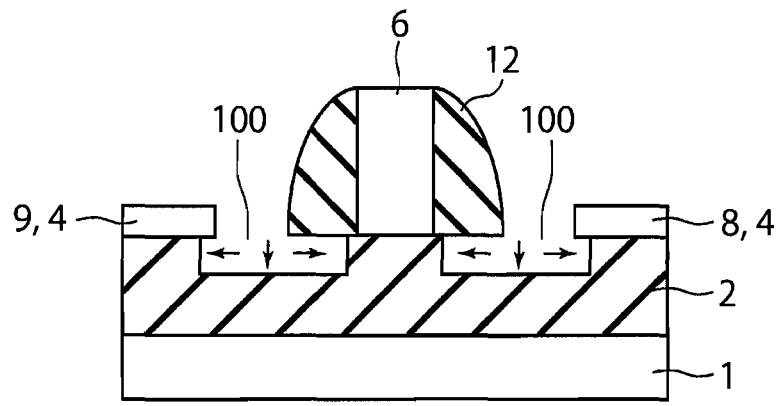
FIG. 15 is a cross-sectional view showing a procedure for manufacturing the semiconductor device according to the first embodiment.

As shown in FIGS. 11 through 15, selective isotropic etching is performed on the oxide film 2 by using wet etching, dry etching, or the like. At this point, the etching is performed on the regions 13 where nothing is provided on the oxide film 2, or on the regions through which the oxide film 2 is exposed (FIG. 11). The etching is then performed gradually on the portions of the oxide film 2 located below the gate sidewalls 12, the source region 8, the drain region 9, and the nanowire portions 10 outside the gate sidewalls 12. As a result, the concave regions 100 are formed (FIG. 12). Of those portions, the portions located below the source region 8 and the drain region 9 are hardly removed by the etching, since the source region 8 and the drain region 9 have large areas. However, the portions of the oxide film 2 located immediately below the nanowire portions 10 having small widths outside the gate sidewalls 12 are completely removed by the etching (FIG. 12). The etching is also performed on the portions of the oxide film 2 located immediately below the gate sidewalls 12, and the etching is continued until the portions of the oxide film 2 located below the nanowire portions 11 immediately below the gate sidewalls 12 are removed (FIG. 12). In the case of wet etching, the etching is controlled by adjusting the density of the etching solution and the etching time. FIG. 11 is a top view of the nanowire transistor in the etching process. FIG. 12 is a cross-sectional view of the nanowire transistor, taken along the section plane J-J defined in FIG. 11. FIG. 3 is a cross-sectional view of the nanowire transistor, taken along the section plane K-K defined in FIG. 11. FIG. 13 is a cross-sectional view of the nanowire transistor, taken along the section plane L-L defined in FIG. 11. FIG. 14 is a cross-sectional view of the nanowire transistor, taken along the section plane M-M defined in FIG. 11. FIG. 15 is a cross-sectional view of the nanowire transistor, taken along the section plane N-N defined in FIG. 11. The cross-section J-J is a cross-section in the gate length direction in the nanowire region. The cross-section L-L is a cross-section in the gate width direction extending through the gate sidewalls 12. The cross-section M-M is a cross-section in the gate width direction outside the gate sidewalls 12. The cross-section N-N is a cross-section in the gate length direction outside the gate sidewalls 12. It should be noted that the arrows shown in FIGS. 11, 12, and 14 indicate the directions in which the etching is performed on the oxide film 2. As can be seen from FIG. 12, the portions of the oxide film 2 located immediately below the nanowire portions 10 and 11 are removed by the etching, and cavities (the concave regions) 100 are formed immediately below the nanowire portions 10 and 11. As can be seen from FIGS. 11 through 15, the oxide film 2 has smaller film thicknesses and has concave shapes in the regions 100 that exclude the regions of the oxide film 2 located immediately below the gate electrode 6 and the regions of the oxide film 2 where the source region 8 and the drain region 9 are formed.

Selective epitaxial growth of Si is then performed. The channel region 3 covered with the gate insulating film 5 is not epitaxially grown. In the source region 8 and the drain region 9, on the other hand, the volume of the silicon layer 4 expands upward through the epitaxial growth. In the nanowire portions 10 outside the gate sidewalls 12, the volume of the silicon layer 4 expands vertically and horizontally through the epitaxial growth (see FIG. 5, for example). In the nanowire portions 11 immediately below the gate sidewalls 12, the volume of the silicon layer 4 expands downward or toward the concave regions 100 through the epitaxial growth.

The sidewalls 12 are then removed by using selective etching such as wet etching or dry etching, and the sidewalls 7 made of an insulating material with low permittivity are formed, to reduce the parasitic capacitance. The sidewalls 7 with low permittivity can be oxide films, for example. At this point, a cross-section taken along a section plane parallel to the direction from the source region 8 toward the drain region 9 outside the nanowire region, or a cross-section taken along the section plane E-E defined in FIG. 1, for example, is the same as the cross-section shown in FIG. 6. The step of replacing the gate sidewalls 12 with the gate sidewalls 7 can be skipped, and the gate sidewalls 12 can be used as they are. In that case, a cross-section taken along a section plane parallel to the direction from the source region 8 toward the drain region 9 outside the nanowire region, or a cross-section taken along the section plane N-N defined in FIG. 11, for example, is the same as the cross-section shown in FIG. 15, except that the source region 8 and the drain region 9 expand through epitaxial growth.

It should be noted that the parasitic resistance can be lowered by implanting ions from obliquely upward into the side faces of the nanowire portions 11 below the gate sidewalls and increasing the impurity density in the nanowire portions 11. Here, "obliquely upward" means a direction that is inclined at an angle larger than 0 degree but smaller than 90 degrees to the normal to the semiconductor substrate, and is inclined at an angle larger than 0 degree but smaller than 90 degrees or at an angle larger than 90 degrees but smaller than 180 degrees to the gate length direction and the gate width direction. The gate length direction is the direction from the source region 8 toward the drain region 9, and the gate width direction is the direction that is substantially perpendicular to the gate length direction.

Thereafter, conventional transistor manufacturing procedures are carried out, to complete a silicon nanowire transistor with a smaller parasitic capacitance and a lower parasitic resistance.

A tri-gate structure having the gate insulating film 5 formed on the side faces and upper face of the channel region 3 has been described in the above description. However, a Fin-FET structure having the gate insulating film 5 formed only on the side faces of the channel region 3 can be used. In that case, the gate electrode is not formed on the upper face of the channel region 3. Alternatively, when the gate electrode is formed, it is necessary to provide an insulating film between the gate electrode and the upper face of the channel region 3.

As described above, in the semiconductor device according to the first embodiment, the volumes of the nanowire portions 11 immediately below the gate sidewalls can be made larger. Accordingly, the parasitic resistance of the nanowire transistor can be lowered, and the on-state current can be dramatically increased.

As the parasitic resistance is lowered, variations in the on-state current, the off-state current, the threshold value, and the like can be reduced.

Since the parasitic resistance can be lowered without a reduction in the gate sidewall thickness, the parasitic capacitance can be reduced by increasing the gate sidewall thickness. That is, the trade-off relationship between the parasitic resistance and the parasitic capacitance depending on the sidewall thickness can be broken.

Also, the thicknesses of the epitaxially-grown films can be made uniform by controlling the depths of the epitaxially-grown portions located Immediately below the gate sidewalls, and variations in the parasitic resistance can be reduced. Accordingly, variations in the on-state current, the off-state current, the threshold value, and the like can be reduced.

Also, the cross-sectional areas in the gate width direction of the nanowire portions 10 and 11 excluding the channel region can be made larger. Accordingly, heat conduction is improved, and current degradation due to a self-heating effect can be reduced.

Although one nanowire region is prepared in this embodiment, two or more nanowire regions can be arranged and connected to the source region 8 and the drain region 9, to increase the current.

In this embodiment, the silicon layer 4 can be a Ge layer, a SIC layer, or a SiGe layer.

In this embodiment, the nanowire region, the source region, and the drain region are single-crystal semiconductors. However, those regions can be polycrystalline semiconductors or amorphous semiconductors.

Second Embodiment

Figure 16:
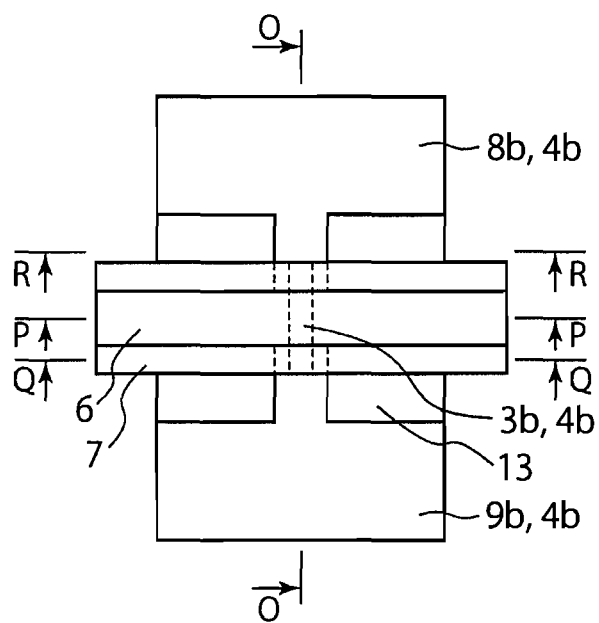
FIG. 16 is a top view of a semiconductor device according to a second embodiment.
Figure 17:
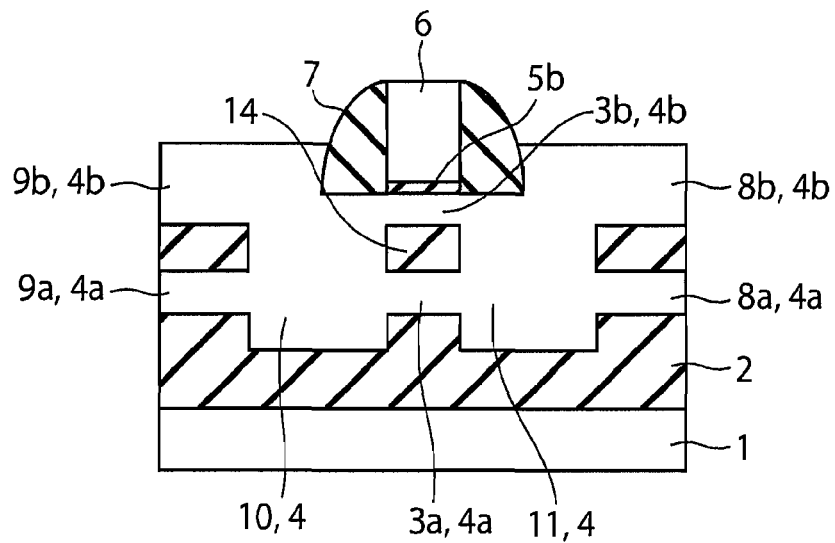
FIG. 17 is a cross-sectional view of the semiconductor device of the second embodiment, taken along the section plane O-O defined in FIG. 16.
Figure 18:
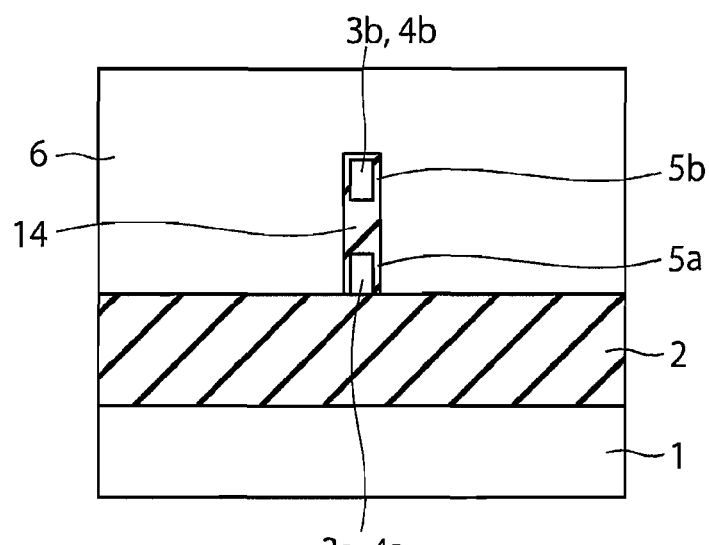
FIG. 18 is a cross-sectional view of the semiconductor device of the second embodiment, taken along the section plane P-P defined in FIG. 16.
Figure 19:
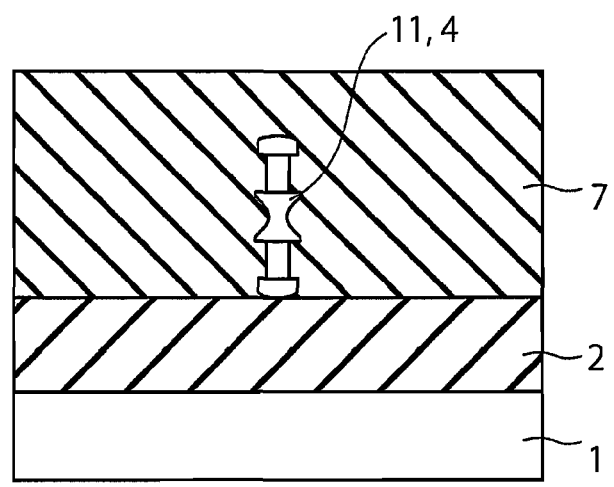
FIG. 19 is a cross-sectional view of the semiconductor device of the second embodiment, taken along the section plane Q-Q defined in FIG. 16.
Figure 20:
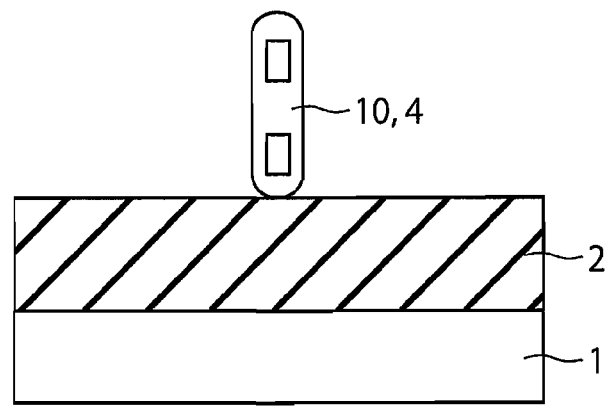
FIG. 20 is a cross-sectional view of the semiconductor device of the second embodiment, taken along the section plane R-R defined in FIG. 16.

Referring now to FIGS. 16 through 26, a semiconductor device according to a second embodiment is described. The semiconductor device of this embodiment includes a stack-type nanowire transistor. FIG. 16 is a top view of the stack-type nanowire transistor. FIG. 17 is a cross-sectional view of the nanowire transistor, taken along the section plane O-O defined in FIG. 16. FIG. 18 is a cross-sectional view of the nanowire transistor, taken along the section plane P-P defined in FIG. 16. FIG. 19 is a cross-sectional view of the nanowire transistor, taken along the section plane Q-Q defined in FIG. 16. FIG. 20 is a cross-sectional view of the nanowire transistor, taken along the section plane R-R defined in FIG. 16. The cross-section O-O is a cross-section in the gate length direction in the nanowire region. The cross-section P-P is a cross-section in the gate width direction extending through the gate electrode. The cross-section Q-Q is a cross-section in the gate width direction extending through the gate sidewalls. The cross-section R-R is a cross-section in the gate width direction outside the gate sidewalls.

This second embodiment is the same as the first embodiment, except that the nanowire structure is formed by stacking at least one more nanowire region on a nanowire region, with an insulating layer (an oxide film) being interposed in between.

In this nanowire transistor of the second embodiment, an insulating film such as an oxide film 2 is placed on a silicon substrate 1. As in the first embodiment, the oxide film 2 has concave shapes in regions excluding the region located immediately below a gate electrode 6 and the regions where a source region 8 and the drain region 9 are formed (FIGS. 17 and 20). A silicon layer 4a is placed on convex regions of the oxide film 2. The convex regions are the region that is located immediately below the gate electrode 6 and has the nanowire region formed thereon, and the regions where the source/drain regions are formed. An oxide film 14 is placed on the silicon layer 4a, and a silicon layer 4b is placed on the oxide film 14 (FIGS. 17 and 18). The portions of the silicon layers 4a and 4b located immediately below the gate electrode 6 in the nanowire region serve as channel regions 3a and 3b. That is, the oxide film 14 is provided between the channel region 3a and the channel region 3b. A gate insulating film 5a is placed on the side faces extending in the gate length direction of the channel region 3a, and a gate insulating film 5b is placed on the side faces extending in the gate length direction and the upper face of the channel region 3b (FIGS. 17 and 18). The gate electrode 6 is placed to cover the gate insulating films 5a and 5b. Gate sidewalls 7 made of an insulating material are provided on the side faces extending in the gate width direction of the gate electrode 6.

The source region and the drain region are formed with the stacked silicon layers 4a and 4b, with the oxide film 14 being interposed in between. That is, the portions of the silicon layers 4a and 4b in the source region serve as source regions 8a and 8b, and the portions of the silicon layers 4a and 4b in the drain region serve as drain regions 9a and 9b. The channel region 3a is connected to the source region 8a and the drain region 9a by the silicon layer 4a in the nanowire region, and the channel region 3b is connected to the source region 8b and the drain region 9b by the silicon layer 4b in the nanowire region. The connecting portions of the silicon layers 4a and 4b serve as nanowire portions 10 and 11. The nanowire portions 11 are the portions located immediately below the gate sidewalls 7 in the nanowire region, and the nanowire portions 10 are the portions located outside the gate sidewalls 7 in the nanowire region. The nanowire portions 10 are designed to extend from the upper faces of the concave regions of the oxide film 2 to the upper faces of the source region 8b and the drain region 9b (FIGS. 17 and 20), and the nanowire portions 11 are designed to extend from the upper faces of the concave regions of the oxide film 2 to the lower faces of the gate sidewalls 7 (FIGS.

17 and 19). As will be described later, some portions of the nanowire portions 10 and 11, such as the portions buried in the concave regions of the oxide film 2, the portions corresponding to the oxide film 14, and the portions located between the gate sidewalls 7 and the source and drain regions 8b and 9b, are formed through epitaxial growth.

In this embodiment, single-crystal silicon is used as the silicon layers 4a and 4b. However, amorphous silicon or polycrystalline silicon can be used, instead of single-crystal silicon.

In the nanowire transistor having the above described structure, the regions on which the gate electrode 6 is formed in the nanowire region functions as the channel regions 3a and 3b. The channel regions 3a and 3b each have a plate-like structure (a nanowire structure) that is approximately 3 to 25 nm in width or length in the gate width direction, and is approximately 3 to 40 nm in height. The volumes of the source region 8b and the drain region 9b expand upward through epitaxial growth as will be described later. The volumes of the nanowire portions 10 located outside the gate sidewalls 7 expand vertically and horizontally through epitaxial growth, and the upper and lower silicon layers 4a and 4b are connected. In the nanowire portions 11 located immediately below the gate sidewalls 7, the silicon layer 4a expands upward and downward through epitaxial growth, and the silicon layer 4b expands downward through epitaxial growth. As a result, the upper and lower silicon layers 4a and 4b are connected.

Figure 21:
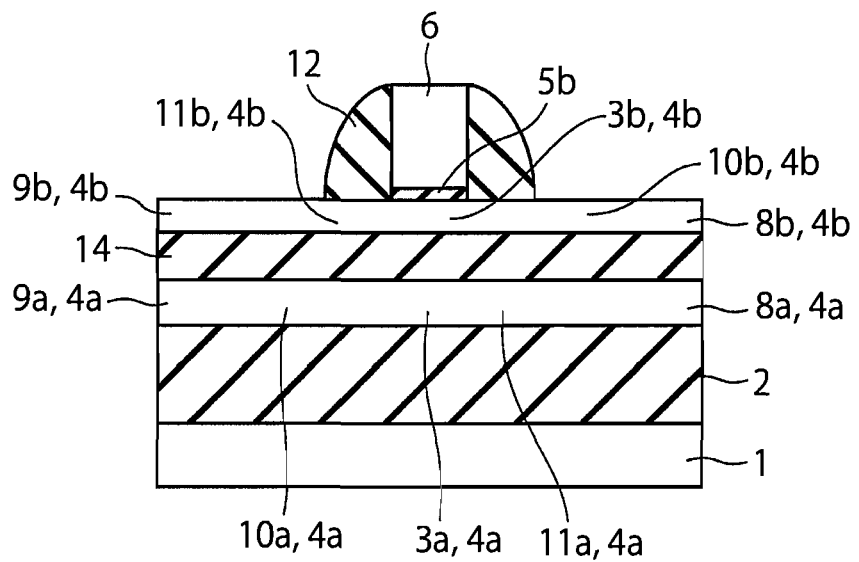
FIG. 21 is a cross-sectional view showing a procedure for manufacturing the semiconductor device according to the second embodiment.
Figure 22:
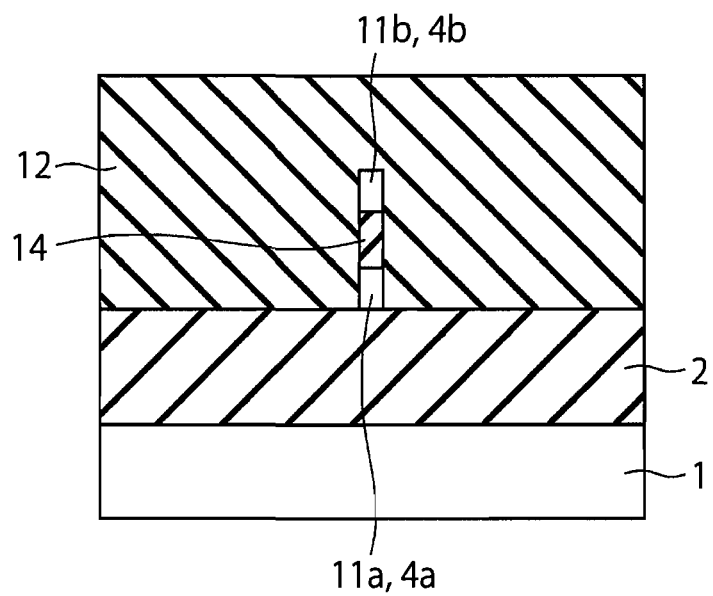
FIG. 22 is a cross-sectional view showing a procedure for manufacturing the semiconductor device according to the second embodiment.
Figure 23:
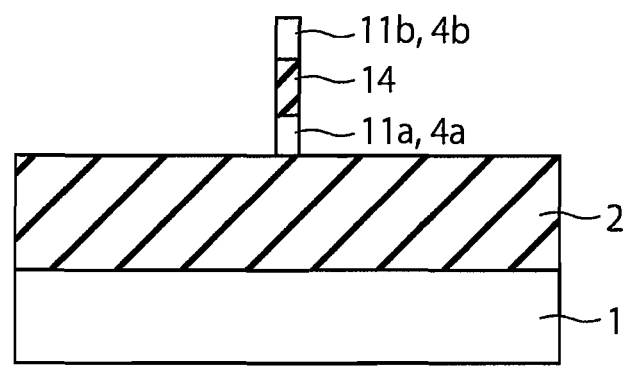
FIG. 23 is a cross-sectional view showing a procedure for manufacturing the semiconductor device according to the second embodiment.

Referring now to FIGS. 21 through 23, a method of manufacturing the semiconductor device according to the second embodiment is described. FIG. 21 is a cross-sectional view of the nanowire transistor in the nanowire region, taken in the gate length direction. FIG. 22 is a cross-sectional view of the nanowire transistor, taken in the gate width direction extending through the gate sidewalls. FIG. 23 is a cross-sectional view of the nanowire transistor outside the gate sidewalls, taken in the gate width direction.

First, as shown in FIG. 21, the oxide film 2, the first silicon layer 4a, the oxide film 14, and the second silicon layer 4b are sequentially formed on the bulk silicon substrate 1. Patterning is then performed on the film stack, to form a nanowire structure including at least one nanowire region. Two wide regions each having a larger film-plane area than the nanowire region are formed at both ends of the nanowire structure, and the film stacks of the first silicon layer 4a and the second silicon layer 4b in the two wide regions form the source and drain regions, respectively. The portions of the first silicon layer 4a, the oxide film 14, and the second silicon layer 4b in the nanowire region form the nanowire region (FIG. 21). This nanowire region includes the channel regions 3a and 3b, and nanowire portions 10a, 10b, 11a, and 11b.

The gate insulating films 5a and 5b are formed on the side faces extending in the gate length direction of the channel regions 3a and 3b, and the gate insulating film 5b is also formed on the upper face of the channel region 3b. The gate electrode 6 is formed to cover those gate insulating films 5a and 5b. Gate sidewalls 12 made of an insulating material are formed on the side faces extending in the gate width direction of the gate electrode 6. The top view of the nanowire transistor in this situation is the same as the top view shown in FIG. 7. FIG. 21 is a cross-sectional view of the nanowire transistor, taken along the section plane F-F defined in FIG. 7. FIG. 22 is a cross-sectional view of the nanowire transistor, taken along the section plane H-H defined in FIG. 7. FIG. 23 is a cross-sectional view of the nanowire transistor, taken along the section plane I-I defined in FIG. 7. The thickness of each of the silicon layers 4a and 4b is approximately 3 to 40 nm. The cross-section of the nanowire transistor taken along the section plane G-G in the gate width direction extending through the gate electrode 6 as shown in FIG. 7 is the same as the cross-section shown in FIG. 18. The nanowire portions located outside the gate sidewalls 12 are denoted by reference numerals 10a and 10b, and the nanowire portions located below the gate sidewalls 12 are denoted by reference numerals 11a and 11b. In this embodiment, single-crystal silicon is used as the silicon layers 4a and 4b. However, polycrystalline silicon or amorphous silicon can be used, instead of single-crystal silicon. Silicon nitride films can be used as the gate sidewalls 12, for example.

Figure 24:
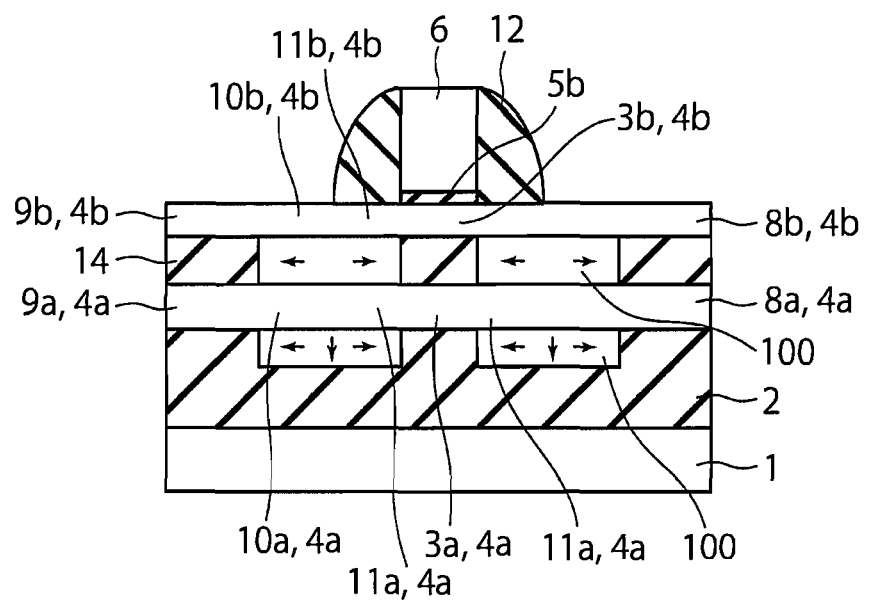
FIG. 24 is a cross-sectional view showing a procedure for manufacturing the semiconductor device according to the second embodiment.
Figure 25:
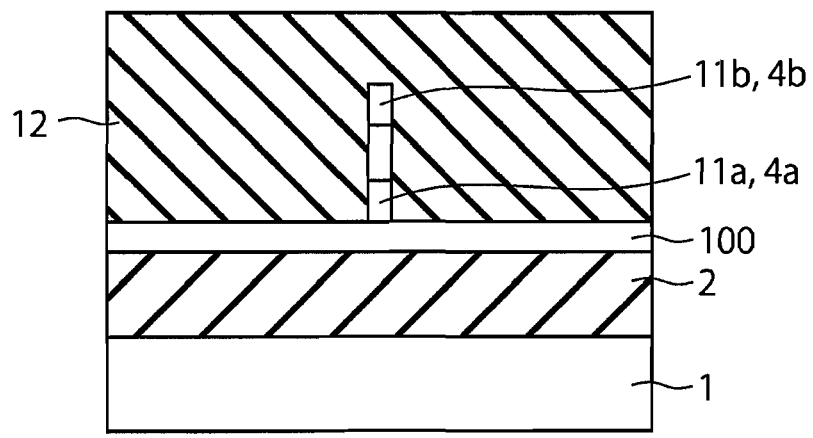
FIG. 25 is a cross-sectional view showing a procedure for manufacturing the semiconductor device according to the second embodiment.
Figure 26:
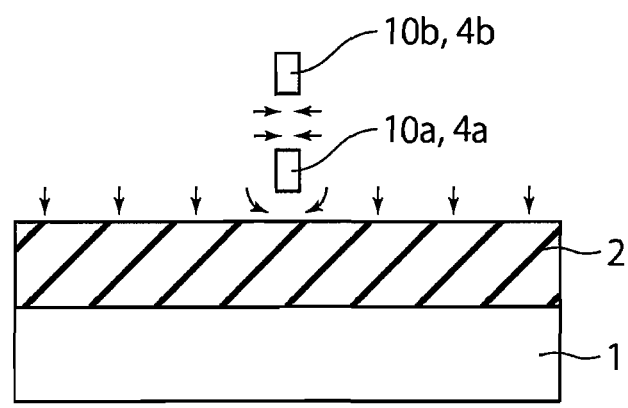
FIG. 26 is a cross-sectional view showing a procedure for manufacturing the semiconductor device according to the second embodiment.

As shown in FIGS. 24 through 26, selective isotropic etching is performed on the oxide films 2 and 14 by using wet etching, dry etching, or the like. At this point, the etching is performed on the regions 13 where nothing is provided on the oxide film 2, or on the regions through which the surface of the oxide film 2 is exposed. The etching is then performed gradually on the portions of the oxide films 2 and 14 located below the gate sidewalls 12, the source regions 8a and 8b, the drain regions 9a and 9b, and the channel regions 3a and 3b. Of those portions, the portions located below the source regions 8a and 8b and the drain regions 9a and 9b are hardly removed by the etching, since the source regions 8a and 8b and the drain regions 9a and 9b have large areas. However, the portions of the oxide film 2 located below the channel regions 3a and 3b having small widths are completely removed by the etching. The etching is also performed on the portions of the oxide films 2 and 14 located below the gate sidewalls 12, and the etching is continued until the portions of the oxide films 2 and 14 located below the nanowire portions 11a and 11b below the gate sidewalls 12 are removed. In the case of wet etching, the etching is controlled by adjusting the density of the etching solution and the etching time. The top view of the nanowire transistor in the etching process is the same as the top view shown in FIG. 11. FIG. 24 is a cross-sectional view of the nanowire transistor, taken along the section plane J-J defined in FIG. 11. FIG. 25 is a cross-sectional view of the nanowire transistor, taken along the section plane L-L defined in FIG. 11. FIG. 26 is a cross-sectional view of the nanowire transistor, taken along the section plane M-M defined in FIG. 11. The cross-section J-J is a cross-section in the gate length direction in the nanowire region. The cross-section L-L is a cross-section in the gate width direction extending through the gate sidewalls 12. The cross-section M-M is a cross-section in the gate width direction outside the gate sidewalls 12. The cross-section of the nanowire transistor taken along the section plane K-K in the gate width direction extending through the gate electrode as shown in FIG. 11 is the same as the cross-section shown in FIG. 18. It should be noted that the arrows shown in FIGS. 11, 24, and 26 indicate the directions in which the etching is performed on the oxide films 2 and 14.

Selective epitaxial growth of Si is then performed. The channel regions 3a and 3b covered with the gate insulating films 5a and 5b are not epitaxially grown. In the source region 8b and the drain region 9b, on the other hand, the volume of the silicon layer 4b expands upward through the epitaxial growth. In the nanowire portions 10a and 10b outside the gate sidewalls 12, the volumes of the silicon layers 4a and 4b expand vertically and horizontally through the epitaxial growth. As a result, the silicon layers 4a and 4b are connected. In the nanowire portions 11a and 11b immediately below the gate sidewalls 12, the volume of the silicon layer 4a expands upward and downward through the epitaxial growth, and the volume of the silicon layer 4b expands downward. As a result, the silicon layers 4a and 4b are connected.

The sidewalls 12 are then removed by using selective etching such as wet etching or dry etching, and the sidewalls 7 with low permittivity are formed, to reduce the parasitic capacitance. The sidewalls 7 with low permittivity can be oxide films, for example. The step of replacing the gate sidewalls 12 with the gate sidewalls 7 can be skipped.

It should be noted that the parasitic resistance can be lowered by implanting ions from obliquely upward into the side faces of the nanowire portions 11a and 11b located immediately below the gate sidewalls and increasing the impurity density.

Thereafter, conventional transistor manufacturing procedures are carried out, to complete a silicon nanowire transistor with a smaller parasitic capacitance and a lower parasitic resistance.

A tri-gate structure that has the gate insulating film 5a formed on the side faces of the channel region 3a and has the gate insulating film 5b formed on the side faces and upper face of the channel region 3b has been described in the above description. However, a Fin-FET structure having the gate insulating film 5b not formed on the upper face of the channel region 3b can be used. In that case, the gate electrode is not formed on the upper face of the channel region 3b. When the gate electrode is formed, it is necessary to provide an insulating film between the gate electrode and the upper face of the channel region 3b.

In the above description, the silicon layers 4a and 4b are connected through epitaxial growth. However, the silicon layers 4a and 4b cannot be connected through epitaxial growth, but can be electrically connected in an interconnecting step. Also, in this embodiment, the source region 8a and the drain region 9a are isolated from the source region 8b and the drain region 9b by the oxide film 14. However, a common source region and a common drain region can be formed in the step illustrated in FIG. 21.

In this embodiment, the nanowire region has a stack structure formed with two silicon layers. However, the nanowire region can have a stack structure formed with three or more silicon layers.

As described above, by this manufacturing method, the volumes of the nanowire portions located below the sidewalls can be made larger as in the first embodiment. Accordingly, the parasitic resistance of the nanowire transistor can be lowered, and the on-state current can be dramatically increased.

As the parasitic resistance is lowered, variations in the on-state current, the off-state current, the threshold value, and the like can be reduced.

Since the parasitic resistance can be lowered without a reduction in the sidewall thickness, the parasitic capacitance can be reduced by increasing the sidewall thickness. That is, the trade-off relationship between the parasitic resistance and the parasitic capacitance depending on the sidewall thickness can be broken.

Also, the thicknesses of the epitaxially-grown layers can be made uniform by controlling the depths of the epitaxially-grown portions located immediately below the sidewalls, and variations in the parasitic resistance can be reduced. Accordingly, variations in the on-state current, the off-state current, the threshold value, and the like can be reduced.

Also, the nanowire portions excluding the channel regions can be made larger. Accordingly, heat conduction is improved, and current degradation due to a self-heating effect can be reduced.

In this embodiment, one nanowire region is prepared in this embodiment when seen from above the channel regions 3a and 3b. However, two or more channel regions 3a and two or more channel regions 3b can be arranged and connected to the source regions 8a and 8b and the drain regions 9a and 9b, to increase the current.

In this embodiment, the nanowire region, the source regions, and the drain regions are Si layers. However, Ge layers, SIC layers, or SiGe layers can be used. Also, in this embodiment, the nanowire region, the source regions, and the drain regions are single-crystal semiconductors. However, those regions can be polycrystalline semiconductors or amorphous semiconductors.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A semiconductor device comprising:
an insulating film including: a first region; second and third regions arranged at a distance from each other, the first region being interposed between the second and third regions; and fourth and fifth regions each having a concave shape, the fourth region being located between the first region and the second region, and the fifth region being located between the first region and the third region;
a source region and a drain region disposed on upper faces of the second and third regions, respectively;
a semiconductor layer extending from the source region to the drain region in a first direction and connected to the source and drain regions, the semiconductor layer disposed on the first region, the fourth region and the fifth region, the semiconductor layer having a smaller width than a width of each of the source region and the drain region in a second direction intersecting the first direction and along the upper faces, the semiconductor layer having a first portion, a second portion, and a third portion, the first portion being located on the first region, the second portion being located on the fourth region, the third portion being located on the fifth region;
a gate electrode disposed opposite to at least a side face of the first portion;
a gate insulating film disposed between the gate electrode and at least the side face of the first portion; and
gate sidewalls disposed on side faces of the gate electrode, the side faces facing the source region and the drain region, the gate sidewalls being made of an insulating material,
a film thickness of the first region below the first portion being thicker than that of each of the fourth and fifth regions below the second and third portions, and each of the second portion and the third portion having a greater film thickness than a film thickness of the first portion, wherein
the gate insulating film is disposed on an upper face of the first portion, the gate electrode is disposed on the gate insulating film on the upper face of the first portion,
a part of the second portion is disposed immediately below one of the gate sidewalls facing the source region,
a part of the third portion is disposed immediately below another of the gate sidewalls facing the drain region,
a film thickness of the part of the second portion is greater than the film thickness of the first portion and not greater than a film thickness of the second portion except the part of the second portion, and
a film thickness of the part of the third portion is greater than the film thickness of the first portion and not greater than a film thickness of the third portion except the part of the third portion.

\* \* \* \* \*